United States Patent
Bao et al.

(10) Patent No.: US 10,340,340 B2
(45) Date of Patent: Jul. 2, 2019

(54) MULTIPLE-THRESHOLD NANOSHEET TRANSISTORS

(71) Applicant: INTERNATIONAL BUSINESS MACHINES CORPORATION, Armonk, NY (US)

(72) Inventors: Ruqiang Bao, Niskayuna, NY (US); Michael A. Guillorn, Cold Springs, NY (US); Terence B. Hook, Jericho, VT (US); Nicolas J. Loubet, Guilderland, NY (US); Robert R. Robison, Colchester, VT (US); Reinaldo A. Vega, Mahopac, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/298,737

(22) Filed: Oct. 20, 2016

(65) Prior Publication Data

US 2018/0114833 A1 Apr. 26, 2018

(51) Int. Cl.

| H01L 29/06 | (2006.01) |
| H01L 29/423 | (2006.01) |
| H01L 29/08 | (2006.01) |
| H01L 29/10 | (2006.01) |
| H01L 29/786 | (2006.01) |

(Continued)

(52) U.S. Cl.
CPC .......... *H01L 29/0673* (2013.01); *B82Y 10/00* (2013.01); *H01L 21/823412* (2013.01); *H01L 29/0653* (2013.01); *H01L 29/0847* (2013.01); *H01L 29/1033* (2013.01); *H01L 29/42392* (2013.01); *H01L 29/66439* (2013.01);

(Continued)

(58) Field of Classification Search
CPC ..... H01L 21/823807; H01L 21/823821; H01L 21/823828; H01L 21/823857; H01L 27/0922; H01L 27/0924; H01L 27/0688; H01L 29/0665; H01L 29/067; H01L 29/0673; H01L 29/1033; H01L 29/4232; H01L 29/66439; H01L 29/66545; H01L 29/66613; H01L 29/775; H01L 29/78; H01L 29/785; H01L 29/78696; H01L 29/125; H01L 29/0847; H01L 29/41791; H01L 29/66575; H01L 29/42392; H01L 29/161; H01L 21/823437; H01L 2029/7858; H01L 29/66795; Y10S 977/762; Y10S 977/938; B82Y 40/00
See application file for complete search history.

(56) References Cited

U.S. PATENT DOCUMENTS 8,679,902 B1 * 3/2014 Basker .............. H01L 29/66439
257/E21.051
9,224,811 B2 * 12/2015 Cheng ................ H01L 29/0673

(Continued)

*Primary Examiner* — Sophia T Nguyen
(74) *Attorney, Agent, or Firm* — Tutunjian & Bitetto, P.C.; Vazken Alexanian (57) ABSTRACT

Semiconductor devices and methods of making the same include forming a stack of alternating layers of channel material and sacrificial material. The sacrificial material is etched away to free the layers of channel material. A gate stack is formed around the layers of channel material. At least one layer of channel material is deactivated. Source and drain regions are formed in contact with the at least one layer of active channel material.

2 Claims, 5 Drawing Sheets

Grow source/drain material from ends of channel layers
402

Recess growth so that only the bottom layer connects to the source/drain regions
404

(51) Int. Cl.
  *B82Y 10/00* (2011.01)
  *H01L 29/66* (2006.01)
  *H01L 21/8234* (2006.01)
  *H01L 27/088* (2006.01)
  *H01L 29/775* (2006.01)

(52) U.S. Cl.
  CPC .......... *H01L 29/786* (2013.01); *H01L 27/088* (2013.01); *H01L 29/775* (2013.01)

(56) References Cited

U.S. PATENT DOCUMENTS

| | | | |
|---|---|---|---|
| 9,425,293 B1* | 8/2016 | Balakrishnan | H01L 29/0673 |
| 9,437,501 B1* | 9/2016 | Cheng | H01L 21/823807 |
| 9,450,046 B2* | 9/2016 | Wen | H01L 21/02532 |
| 9,472,555 B1* | 10/2016 | Balakrishnan | H01L 27/0924 |
| 9,484,447 B2* | 11/2016 | Kim | H01L 29/0673 |
| 9,490,335 B1* | 11/2016 | Doris | H01L 27/0922 |
| 9,564,522 B2* | 2/2017 | Cea | H01L 29/42392 |
| 9,653,547 B1* | 5/2017 | Chang | H01L 29/0673 |
| 9,853,124 B2* | 12/2017 | Barraud | H01L 29/66553 |
| 2006/0024874 A1* | 2/2006 | Yun | H01L 29/42392 438/197 |
| 2006/0121679 A1* | 6/2006 | Lee | H01L 29/66772 438/300 |
| 2007/0196973 A1* | 8/2007 | Park | H01L 21/823412 438/197 |
| 2008/0026149 A1* | 1/2008 | Tomasini | C23C 16/04 427/255.28 |
| 2011/0031473 A1* | 2/2011 | Chang | B82Y 10/00 257/24 |
| 2012/0007051 A1 | 1/2012 | Bangsaruntip et al. | |
| 2012/0138888 A1 | 6/2012 | Chang et al. | |
| 2012/0168830 A1* | 7/2012 | Usuda | H01L 21/28518 257/288 |
| 2012/0175696 A1* | 7/2012 | Franzon | H01L 21/28273 257/316 |
| 2012/0319178 A1 | 12/2012 | Chang et al. | |
| 2013/0153993 A1* | 6/2013 | Chang | B82Y 10/00 257/330 |
| 2013/0187207 A1* | 7/2013 | Tang | H01L 29/66795 257/288 |
| 2013/0277714 A1* | 10/2013 | Le | H01L 29/42392 257/190 |
| 2013/0341704 A1* | 12/2013 | Rachmady | H01L 29/66545 257/327 |
| 2014/0097502 A1* | 4/2014 | Sun | H01L 21/823412 257/392 |
| 2014/0149954 A1* | 5/2014 | Yin | G06F 17/5036 716/112 |
| 2014/0151638 A1* | 6/2014 | Chang | H01L 29/42392 257/27 |
| 2014/0151639 A1* | 6/2014 | Chang | H01L 29/42392 257/27 |
| 2014/0175379 A1* | 6/2014 | Chu-Kung | H01L 29/267 257/20 |
| 2014/0175554 A1* | 6/2014 | Loubet | H01L 21/823431 257/368 |
| 2014/0197455 A1* | 7/2014 | Lee | H01L 29/78 257/192 |
| 2014/0225065 A1* | 8/2014 | Rachmady | H01L 29/42392 257/24 |
| 2014/0239255 A1* | 8/2014 | Kang | H01L 29/775 257/24 |
| 2014/0339611 A1* | 11/2014 | Leobandung | H01L 29/78609 257/288 |
| 2015/0069328 A1* | 3/2015 | Leobandung | H01L 29/775 257/24 |
| 2015/0295084 A1* | 10/2015 | Obradovic | H01L 29/7845 257/347 |
| 2015/0333167 A1* | 11/2015 | Leobandung | H01L 29/0673 257/347 |
| 2015/0340457 A1* | 11/2015 | Xie | H01L 29/66545 257/288 |
| 2015/0372104 A1* | 12/2015 | Liu | H01L 29/2364 257/77 |
| 2015/0372115 A1* | 12/2015 | Koh | H01L 29/6656 438/301 |
| 2016/0027929 A1* | 1/2016 | Cheng | H01L 29/78696 257/9 |
| 2016/0079394 A1* | 3/2016 | Li | H01L 29/66795 257/347 |
| 2016/0087053 A1* | 3/2016 | Kim | H01L 29/41783 257/369 |
| 2016/0163599 A1* | 6/2016 | Chang | H01L 21/823418 257/384 |
| 2016/0365411 A1* | 12/2016 | Yeh | H01L 29/0673 |
| 2016/0372607 A1* | 12/2016 | Le | B82Y 10/00 |
| 2017/0018462 A1* | 1/2017 | Suk | H01L 29/78681 |
| 2017/0040321 A1* | 2/2017 | Mitard | H01L 29/78684 |
| 2017/0053998 A1* | 2/2017 | Kim | H01L 29/42392 |
| 2017/0069763 A1* | 3/2017 | Doris | H01L 21/0228 |
| 2017/0110554 A1* | 4/2017 | Tak | H01L 29/4991 |
| 2017/0141112 A1* | 5/2017 | Ching | H01L 27/0924 |
| 2017/0141198 A1* | 5/2017 | Cheng | H01L 29/41791 |
| 2017/0154960 A1* | 6/2017 | Rachmady | H01L 29/0676 |
| 2017/0194213 A1* | 7/2017 | Ching | H01L 21/823821 |
| 2017/0194216 A1* | 7/2017 | Doris | H01L 21/823857 |
| 2017/0271514 A1* | 9/2017 | Kittl | H01L 29/7848 |
| 2018/0090624 A1* | 3/2018 | Cheng | H01L 29/78696 |
| 2018/0197794 A1* | 7/2018 | Kang | H01L 21/823821 |
| 2018/0226490 A1* | 8/2018 | Le | B82Y 10/00 |

* cited by examiner

FIG. 10 ial Field

MULTIPLE-THRESHOLD NANOSHEET TRANSISTORS

BACKGROUND

Technical Field

The present invention generally relates to semiconductor device fabrication and, more particularly, to nanosheet/nanowire transistors that have multiple stacked channel areas, one of which is deactivated.

Description of the Related Art

Nanowire and nanosheet structures are used to form the channels of field effect transistors (FETs). It should be understood that nanowires have a width-to-thickness ratio that is about 2:1 or less, while nanosheets have a width-to-thickness ratio that is about 2:1 or greater. In either case, at least one dimension of the nano-structures has a size on the order of nanometers.

While the characteristics of these devices can be tuned to a certain degree by setting, e.g., the doping properties, thickness, material, etc., the fabrication of the devices is nonetheless limited to a single option at each point on the chip. Complicated fabrication processes, with multiple masking steps, may be needed to create all of the different varieties of nanowire/nanosheet devices that may be needed on a single chip.

SUMMARY

A method of forming a semiconductor device includes forming a stack of alternating layers of channel material and sacrificial material. The sacrificial material is etched away to free the layers of channel material. A gate stack is formed around the layers of channel material. At least one layer of channel material is deactivated. Source and drain regions are formed in contact with the at least one layer of active channel material.

A semiconductor device includes multiple vertically aligned layers of channel material, wherein all but one of the plurality of layers of channel material are deactivated, leaving one activated layer of channel material. A gate stack is formed around the plurality of layers of channel material. A source and drain region is formed in contact with respective ends of the one activated layer of channel material.

An integrated circuit includes multiple field effect transistors (FETs), each FET having a different respective threshold voltage in accordance with an activated channel layer. Each FET includes a plurality of vertically aligned layers of channel material. Each of the plurality of layers has a different associated threshold voltage. All but one of the plurality of layers of channel material are deactivated, leaving one activated layer of channel material. A gate stack is formed around the plurality of layers of channel material. A source and drain region is formed in contact with respective ends of the one activated layer of channel material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use stacked nanowires or nanosheets to create devices (e.g., field effect transistors (FETs)) that can have device properties in accordance with one of several different configurations. In particular, a set of stacked nanowires or nanosheets is formed and all but one layer from the set is deactivated. This produces a nanowire- or nanosheet-channel FET with the appropriate characteristics, as the deactivated layers do not influence the operation of the device.

Using multiple nanowires or nanosheets may be advantageous in some applications to increase current per unit area. In other applications (e.g., static random access memory), the additional current may detract from stability. In such an application, many devices may be formed using a stacked nanowire/nanosheet process, and those which would benefit from having lower current may have channel layers in their stacks partially deactivated. In another example, each layer of the stack may have different designs (e.g., different levels of doping, different thicknesses, different materials) to provide tuned properties (e.g., the threshold voltage).

Figure 1:
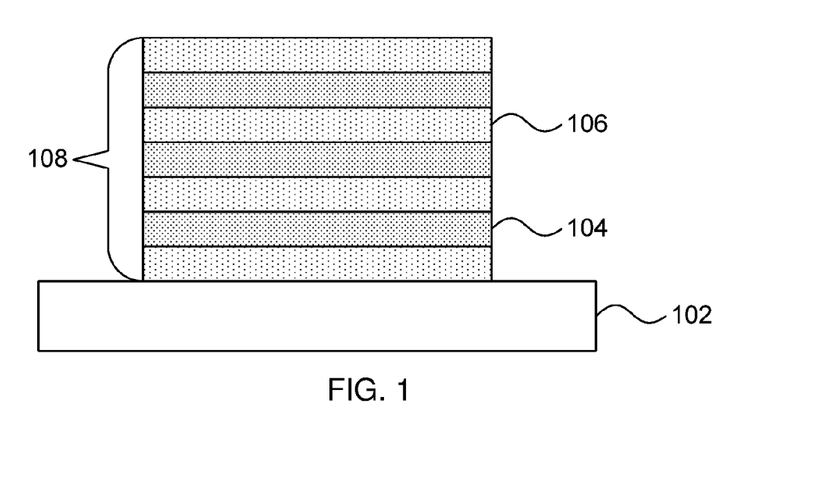
FIG. 1 is a cross-sectional diagram of a step in the formation of a semiconductor device in accordance with the present principles.

Referring now to the drawings in which like numerals represent the same or similar elements and initially to FIG. 1, a cross-sectional diagram of a step in the formation of a semiconductor device is shown. In particular, a stack 108 of alternating semiconductor layers is formed on substrate 102.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in FIG. 1, the semiconductor substrate 102 may alternatively be a semiconductor on insulator (SOI) substrate, having e.g. a buried oxide layer underneath a semiconductor layer.

The stack 108 includes layers of channel material 104 interspersed with sacrificial layers 106. The channel material 104 and the sacrificial layers 106 may be formed from any appropriate material having etch selectivity with respect to one another. In one embodiment, the top layer may be a sacrificial layer 106, whereas in another embodiment the top sacrificial layer 106 may be omitted to leave the top channel layer 104 exposed.

In one specific embodiment, the channel layers 104 are formed from silicon germanium and the sacrificial layers are formed from silicon. The channel layers 104 may be uniform or, in alternative embodiments, may have different properties such as, e.g., different thicknesses or material compositions. Although only embodiments with three channel layers 104 are discussed in detail herein, it should be understood that any number of channel layers 104 may be used, each with different properties.

As used herein, the term "etch selectivity" in reference to a material removal process denotes that the rate of material removal for a first material is greater than the rate of removal for at least another material of the structure to which the material removal process is being applied. The alternating layers 104 and 106 can be deposited by any appropriate mechanism. It is specifically contemplated that the layers may be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

As shown herein, the different sacrificial and channel layers are formed on the substrate 102 and trenches are subsequently formed in the layers to form stack 108. It is specifically contemplated that this etch may be performed as part of a shallow trench isolation (STI) process, but it should be understood that other forms of anisotropic etching may be employed instead.

STI regions are formed by etching a trench in the substrate utilizing a conventional dry etching process such as reactive-ion etching (RIE) or plasma etching. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

The trenches may be formed so as to create nanosheets in the stack 108 or, alternatively, to form nanowires. As noted above, "nanosheets" are defined herein as having a width-to-thickness ratio of at least 2:1, while "nanowires" are defined herein as having a width-to-thickness ratio of 2:1 or less. A single chip may have both nanowire and nanosheet devices integrated on it.

To complete the device, structures are formed at the edges of the channel layers 104 and the sacrificial layers 106 are etched away. It is specifically contemplated that an isotropic etch such as, e.g., a wet or dry chemical etch may selectively remove the sacrificial layers 106 without harming the channel layers 104. However, different processes may be used to selectively disable specific channel layers, or to prevent those layers from contacting the side structures, such that the finished device has only one active channel layer.

Figure 2:
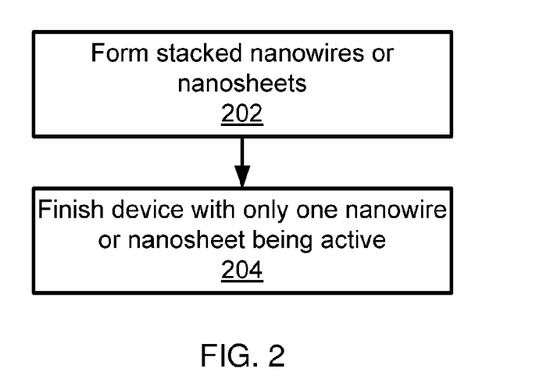
FIG. 2 is a block/flow diagram of a method of forming a semiconductor device in accordance with the present principles.

Referring now to FIG. 2, method of forming a semiconductor device is shown. Block 202 forms stacked nanowire or nanosheet channels. Every embodiment discussed herein begins with the stack of channel layers 104 interspersed by sacrificial layers 106. Block 204 then finishes the device, including the formation of source/drain regions and a gate stack, as will be described in greater detail below. The processes of block 204 may vary, depending on which structure is selected to be the active channel for the device but, when the device is finished, only one of the channel layers 104 will be an active channel layer that functions during operation of the device.

Figure 3:
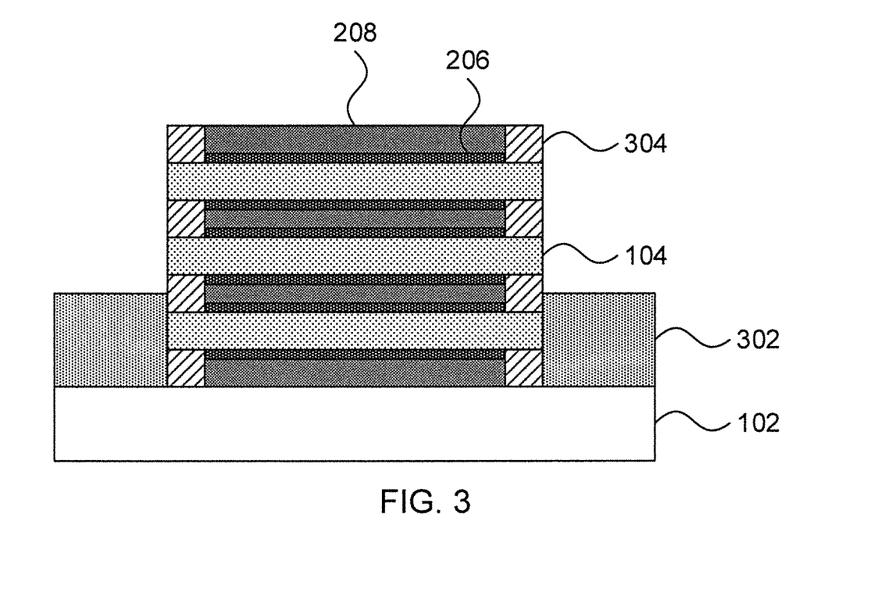
FIG. 3 is a cross-sectional diagram of a step in the formation of a semiconductor device in accordance with the present principles.

Referring now to FIG. 3, a cross-sectional diagram of a step in the formation of a semiconductor device is shown. In this embodiment, the bottom-most channel layer 104 is made active. Source/drain regions 302 are epitaxially grown at the sides of the channel layers 104. The sacrificial layers 106 are etched away and a gate stack is formed, with spacers 304, a gate dielectric, and gate 208. In this embodiment, the source/drain regions 302 are etched down to recess the material such that only one wire is connected. Conductive contacts can then be formed to the source/drain regions 302 and the gate 208 to complete the device.

In one embodiment, the source/drain growths may be formed after the gate stack, with a temporary structure providing a framework for the formation of spacers 204 after the removal of the sacrificial layers 106 and subsequent processing steps. The gate stack may be formed by any appropriate process, including for example, replacement metal gate processes, and may be formed using any appropriate materials. In one embodiment, the spacers 204 may be formed from material such as silicon oxide, the gate dielectric 206 may be a high-k dielectric such as hafnium oxide, zirconium oxide, lanthanum oxide, aluminum oxide, titanium oxide, strontium titanium oxide, lanthanum aluminum oxide, yttrium oxide, hafnium oxynitride, zirconium oxynitride, lanthanum oxynitride, aluminum oxynitride, titanium oxynitride, strontium titanium oxynitride, lanthanum aluminum oxynitride, yttrium oxynitride, etc., and the gate may be an appropriate gate conductor such as, e.g., tungsten, nickel, titanium, molybdenum, tantalum, copper, platinum, silver, gold, ruthenium, iridium, rhenium, rhodium, alloys of the aforementioned metals, doped polysilicon and/or polysilicon-germanium alloys, or polycide materials.

The growth of the source/drain regions may be an epitaxial process. The terms "epitaxial growth" means the growth of a semiconductor material on a deposition surface of a semiconductor material, in which the semiconductor material being grown has substantially the same crystalline characteristics as the semiconductor material of the deposition surface. In one embodiment the source/drain regions 202 may be formed after the gate stack is formed.

In the embodiment of FIG. 3, the source/drain region is initially grown from the exposed surfaces of the channel layers 104, with the growth from the ends of each channel layer 104 merging to form a single structure at each end. An anisotropic etch is then used to selectively remove material from the top of the merged growth structures, lowering the top surfaces of those structures until only the lowest channel layer 104 remains in contact with the recessed source/drain regions 202. It is specifically contemplated that RIE may be used to recess the source/drain regions 202, but any appropriate anisotropic etch may be used instead. A passivating dielectric material (not shown) may be filled in, with conductive contacts being formed to penetrate the passivating dielectric to contact the source/drain regions 202. As a result, no conductive contact is made to the ends of the deactivated channel layers 104.

Figure 4:
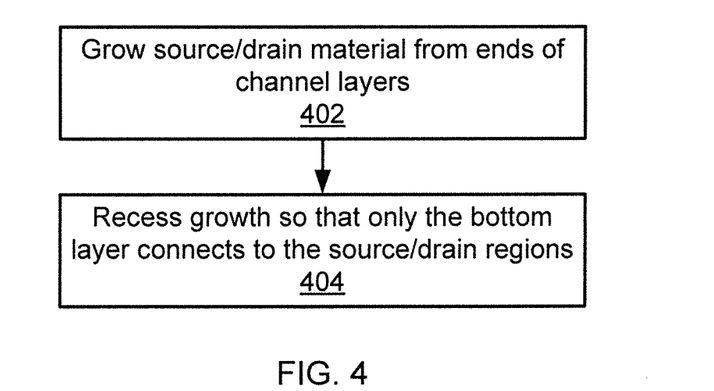
FIG. 4 is a block/flow diagram of a method of deactivating a channel layer in accordance with the present principles.

Referring now to FIG. 4, a method of deactivating channels when fabricating a stacked nanowire/nanosheet device is shown. In particular, FIG. 4 deals with deactivating the top channel layers, leaving only the lowest channel layer operational. Block 402 grows the source/drain material from the ends of the channel layers 104 using, e.g., an epitaxial growth process until the growth regions merge. Block 404 uses an anisotropic etch to recess the growth structures down to the recessed source/drains 202, such that the source/drain regions 202 contact only the lowest channel structure.

Figure 5:
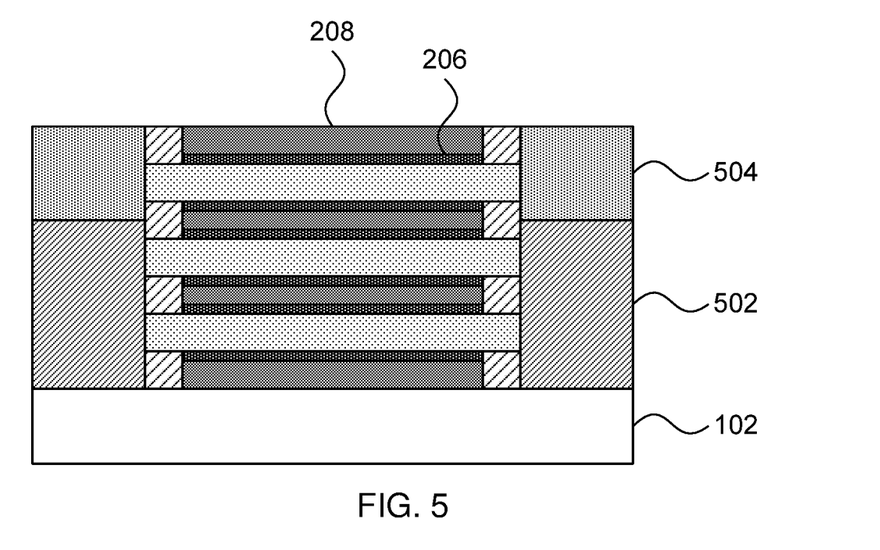
FIG. 5 is a cross-sectional diagram of a step in the formation of a semiconductor device in accordance with the present principles.

Referring now to FIG. 5, a cross-sectional diagram of a step in the formation of a semiconductor device is shown. In this embodiment, the topmost channel layer 104 is activated. A dielectric layer 502 is deposited to a height that blocks the lower two channel layers 104. The elevated source/drain regions 504 are then epitaxially grown from the top channel layer 104. The dielectric layer 502 may be formed from any appropriate insulating material and may be formed using any appropriate process such as, e.g., CVD, ALD, PVD, or GCIB deposition. In one embodiment, the dielectric material is deposited and subsequently etched back to an appropriate height to form the dielectric layer 502.

Figure 6:
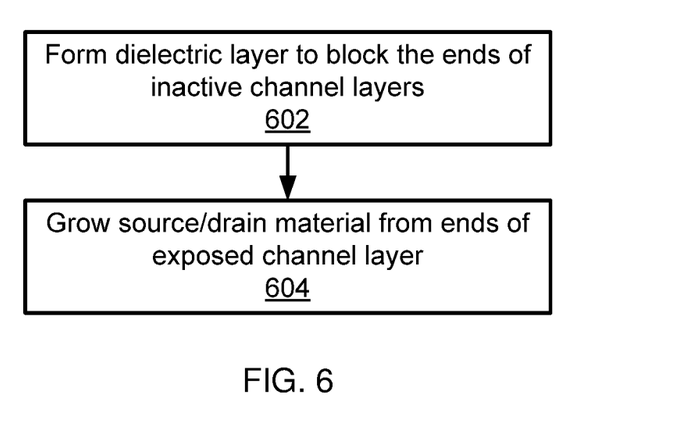
FIG. 6 is a block/flow diagram of a method of deactivating a channel layer in accordance with the present principles.

Referring now to FIG. 6, a method of deactivating channels when fabricating a stacked nanowire/nanosheet device is shown. Block 602 forms the dielectric layer 502 using, e.g., any appropriate combination of deposition and etching back such that the dielectric layer 502 blocks the ends of the inactive channel layers 104. Block 604 then grows source/drain material from the ends of the exposed channel layer 104, in this case the top-most channel layer 104. The presence of the dielectric layer 502 prevents growth from the other channel layers 104, such that only one contact between the source and drain regions exists.

Figure 7:
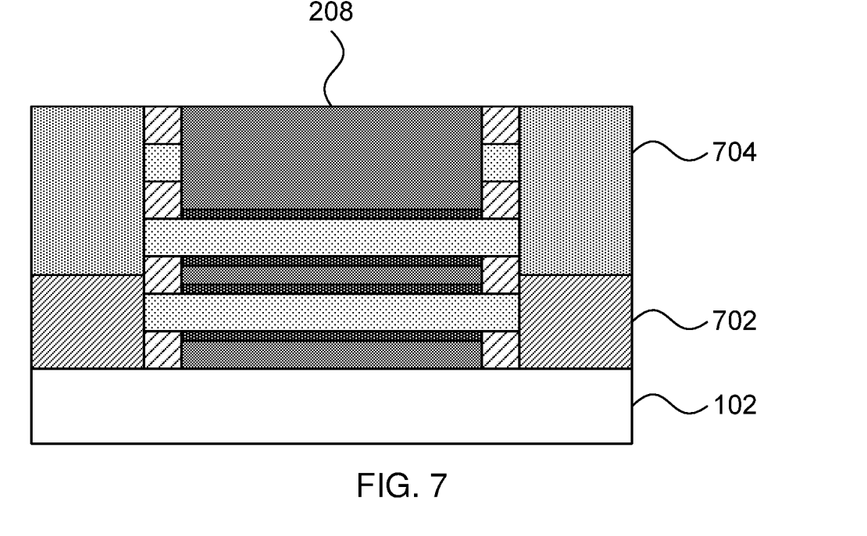
FIG. 7 is a cross-sectional diagram of a step in the formation of a semiconductor device in accordance with the present principles.

Referring now to FIG. 7, a cross-sectional diagram of a step in the formation of a semiconductor device is shown. In this embodiment, the middle channel layer 104 is the only layer left active. The topmost channel layer 104 is etched away before the formation of the gate stack. A dielectric layer 702 is then formed to a height that covers the lowest channel layer 104. Source/drain regions 704 are grown from the ends of the exposed channel layers 104 (noting that a remainder of the top channel layer 104 may be present in the spacer 204 and therefore provide a surface for epitaxial growth). The result is that only the middle channel layer 104 remains to form a connection between the elevated source/drain regions 704, as the lowest channel layer 104 is blocked by the dielectric layer 702 and the top channel layer 104 has been removed.

Figure 8:
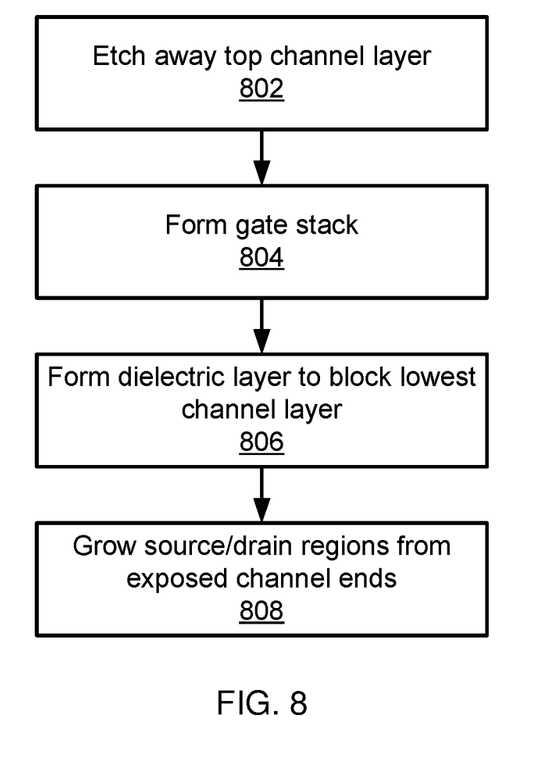
FIG. 8 is a block/flow diagram of a method of deactivating a channel layer in accordance with the present principles.

Referring now to FIG. 8, a method of deactivating channels when fabricating a stacked nanowire/nanosheet device is shown. Block 802 etches away one or more top channel layers 104 using any appropriate etch. This etch may be performed before or after the sacrificial layers 106 are removed. Block 804 then forms the gate stack over the remaining channel layers 104. Block 806 forms a dielectric layer 702 to a height appropriate to block at least one channel layer 104, such that only one whole channel layer remains above the level of the dielectric layer 702. Block 808 grows the source/drain regions 704 from the channel layer ends. As noted above, there may remain portions of the removed channel layer(s) 104 embedded in the spacers 204, such that the source/drain regions 704 will grow in these areas as well.

Figure 9:
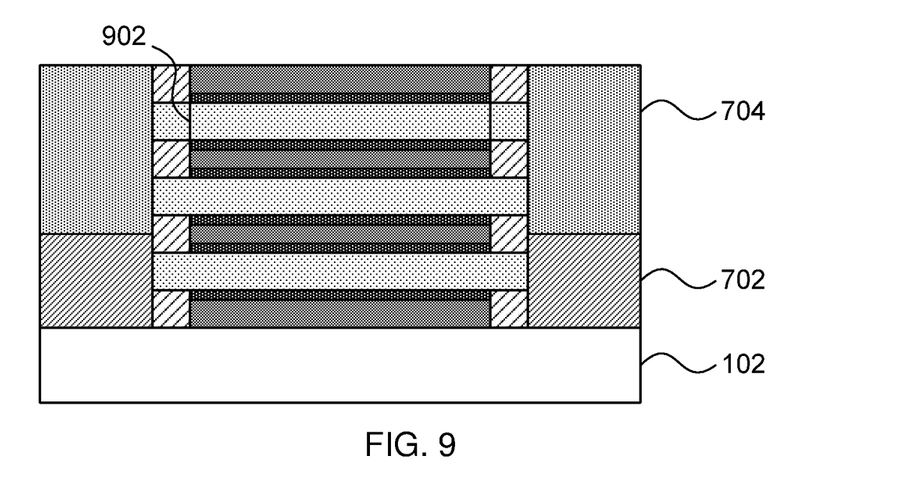
FIG. 9 is a cross-sectional diagram of a step in the formation of a semiconductor device in accordance with the present principles.

Referring now to FIG. 9, a cross-sectional diagram of a step in the formation of a semiconductor device is shown. In this embodiment, the middle channel layer 104 is left active. Rather than removing the topmost channel layer 104, the top layer is deactivated by heavily doping the material such that it loses its semiconducting properties, becoming conductive layer 902. Alternatively, the introduction of the dopant may raise the threshold voltage of the final device above an operating voltage, such that channel behavior in the doped layer 902 is not triggered during operation. The top channel layer 104 may be doped using a low-energy implantation process that does not penetrate to lower channel layers 104. The gate stack, dielectric layer 702, and source/drain regions 704 may be formed as described above, such that only one channel layer 104 remains intact between source/drain regions 704. Appropriate doping at a concentration of $1\times10^{19}/cm^3$ or more will effectively eliminate conduction of that doped nanosheet. Example dopants that may be used include arsenic or phosphorous for p-type devices at an implantation energy of about 10 KeV to about 20 KeV and boron for n-type devices at an implantation energy of about 5 KeV to about 10 KeV.

Figure 10:
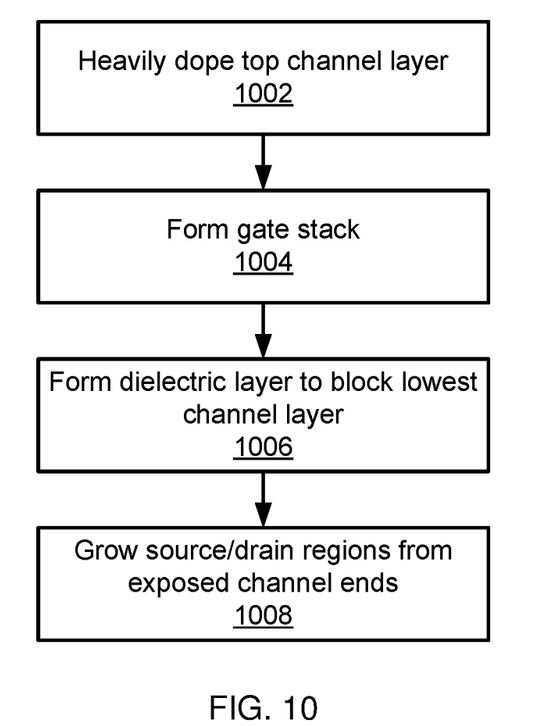
FIG. 10 is a block/flow diagram of a method of deactivating a channel layer in accordance with the present principles.

Referring now to FIG. 10, a method of deactivating channels when fabricating a stacked nanowire/nanosheet device is shown. Block 1002 heavily dopes the top channel layer 104 using, e.g., a low-energy implantation process to disable it as a semiconductor. This implantation should occur before the sacrificial layers 106 are removed, to prevent implantation from affecting lower channel layers 104. Block 1004 forms the gate stack around the channel layers 104. Block 1006 then forms the dielectric layer 702 to cover the ends of at least one of the bottommost channel layers 104. Block 1008 grows source/drain regions 704 from the exposed channel ends.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of multiple-threshold nanosheet transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of forming a semiconductor device, comprising:
    forming a stack of alternating layers of channel material and sacrificial material;
    etching away the sacrificial material to free the layers of channel material;

forming a gate stack around the layers of channel material;

forming source and drain regions by epitaxially growing the source and drain regions from sidewalls of each layer of channel material; and deactivating at least one layer of channel material by etching back the source and drain regions, such that the etched source and drain regions do not contact the at least one deactivated layer of channel material.

2. The method of claim 1, wherein each layer of channel material has a different associated voltage threshold based on dimensions and composition of the respective layer.

\* \* \* \* \*